United States Patent
Chaichanavong

(10) Patent No.: US 10,128,981 B1
(45) Date of Patent: Nov. 13, 2018

(54) MESSAGE-PASSING DECODER WITH FAST CONVERGENCE AND REDUCED STORAGE

(71) Applicant: Marvell International Ltd., Hamilton (BM)

(72) Inventor: Panu Chaichanavong, Bangkok (TH)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 15/652,747

(22) Filed: Jul. 18, 2017

Related U.S. Application Data

(60) Provisional application No. 62/381,918, filed on Aug. 31, 2016.

(51) Int. Cl.
*H04L 1/00* (2006.01)

(52) U.S. Cl.
CPC ........ *H04L 1/0054* (2013.01); *H04L 1/0052* (2013.01)

(58) Field of Classification Search
USPC ................................. 714/774, 752
See application file for complete search history.

(56) References Cited

U.S. PATENT DOCUMENTS

| | | | |
|---|---|---|---|
| 8,458,556 B2* | 6/2013 | Planjery | H03M 13/1117 714/752 |
| 9,453,919 B2* | 9/2016 | Bouvier Des Noes | G01S 19/24 |
| 9,548,764 B1* | 1/2017 | Chilappagari | H03M 13/116 |
| 9,595,977 B2* | 3/2017 | Landau | H03M 13/116 |
| 9,621,188 B2* | 4/2017 | Hof | H03M 13/3707 |
| 9,853,661 B2* | 12/2017 | Tate | H03M 13/1131 |
| 2015/0349807 A1* | 12/2015 | Vernon | H03M 13/353 714/774 |

* cited by examiner

*Primary Examiner* — Eva Puente

(57) ABSTRACT

A message-passing decoder operates by storing, at a check node, a minimum value, a next-to-minimum value, an edge location of the minimum value, and information regarding the signs of incoming messages. For an edge which is not the location of a previous minimum value, the minimum value and the next-to-minimum value, and the location of the minimum value, are set based on the magnitude of an incoming message. For an edge which is the location of the previous minimum value, the minimum value and the next-to-minimum value are set based on the magnitude of an incoming message, and when the magnitude of the incoming message is at most equal to the previous next-to-minimum value, the location of the minimum value is set to the respective edge, and when the magnitude of the incoming message is greater than the previous next-to-minimum value, the location of the minimum value is approximated.

23 Claims, 7 Drawing Sheets

```
900 ─┐
     ┌ if (E==min1loc)
     │    tmp_min1=min2; tmp_min2=infinity (or max value that HW can support);
901 ─┤    tmp_min1loc = (E-1+N) mod N, where N is number of edges of this check node;
     │    // (1) move min2 up to min1
     │ else
902 ─┤    tmp_min1=min1; tmp_min2=min2; tmp_min1loc=min1loc; // (2) do nothing
     └ end
     ┌ if (M<=tmp_min1)
903 ─┤    min1=M; min2=infinity (or max value); min1loc=E; // (3) replace min1
     └
     ┌ else if (M<=tmp_min2)
904 ─┤    min1=tmp_min1; min2=M; min1loc=tmp_min1loc; // (4) replace min2
     └
     ┌ else
905 ─┤    min1=tmp_min1; min2=tmp_min2; min1loc=tmp_min1loc; // (5) do nothing
     └ end
906 ─{ X = X ^ signs [E] ^ S; // (6) The notation ^ denotes XOR operation.
907 ─{ signs [E] = S; // (7) replace the sign in storage
```

FIG. 9

MESSAGE-PASSING DECODER WITH FAST CONVERGENCE AND REDUCED STORAGE

CROSS REFERENCE TO RELATED APPLICATION

This claims the benefit of, commonly-assigned U.S. Provisional Patent Application No. 62/381,918, filed Aug. 31, 2016, which is hereby incorporated by reference herein in its entirety.

FIELD OF USE

This disclosure relates to decoders used in data storage systems or data transmission systems.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the present disclosure.

One type of decoder used in a communication channel (which may include the read channel of a data storage device, or the receiver of a wired or wireless data transmission system) is a message-passing decoder. A message-passing decoder operates on log-likelihood ratios (LLRs) that have been output by a detector (e.g., a Viterbi detector) in the read channel of a data storage system, or by the demodulator of a receiver channel in a data transmission system, to decode data that has been encoded with a linear code, such as a low-density parity check (LDPC) code. A linear code can be represented by a graph, including variable nodes that correspond to the encoded data, and check nodes that show the check constraints on the data, imposed by the code. A typical message-passing decoder proceeds sequentially from node to node. The order of operation can be determined based on the variable nodes or the check nodes. For whichever type of node (variable or check) determines the order, for any one node of that type, all nodes of the other type that are adjacent the one node of that type generate messages for that one node of that type. Based on those messages, new messages are computed by the one node of that type and returned from the one node of that type to the adjacent ones of the nodes of the other type also in the form of LLRs. The process is repeated until a stopping criterion is met.

A relatively large amount of data is used at each node. Techniques are available to reduce the amount of data that must be stored, but those techniques results in slower convergence of the decoder.

SUMMARY

A method according to implementations of the subject matter of this disclosure for operating a message-passing decoder on data received in a communication channel includes storing, at a check node of the message-passing decoder, a minimum value among magnitudes of incoming messages on all edges, a next-to-minimum value among magnitudes of incoming messages on all edges, an edge location of the minimum value, and information regarding the signs of incoming messages. At respective edges of the check node, incoming messages from respective variable nodes are received. For a respective edge of the check node which is other than the edge location of a previous minimum value, the minimum value and the next-to-minimum value are set, and the location of the minimum value is set, based on the magnitude of an incoming message. For a respective edge of the check node which is the edge location of the previous minimum value, the minimum value and the next-to-minimum value are set based on the magnitude of an incoming message, and when the magnitude of the incoming message is at most equal to the previous next-to-minimum value, the location of the minimum value is set to the respective edge, and when the magnitude of the incoming message is greater than the previous next-to-minimum value, the location of the minimum value is approximated.

For a respective edge, a return message is sent on that respective edge based on the stored minimum value up to the present time, the stored next-to-minimum value up to the present time, the stored location of the minimum value at the present time, the stored result of the exclusive-OR operation on all incoming signs up to the present time, and the stored incoming sign on the respective edge.

In such an implementation, for a respective edge of the check node which is other than the edge location of the previous minimum value, the minimum value and the next-to-minimum value may be set, and the location of the minimum value may be set, based on the magnitude of the incoming message, as follows. When the magnitude of the incoming message is at most equal to a previous minimum value, the previous minimum value may be replaced with the magnitude of the incoming message, the next-to-minimum value may be set to a maximum value, and the location of the minimum value may be set to the respective edge. When the magnitude of the incoming message is greater than the previous minimum value and at most equal to the next-to-minimum value, the minimum value may be set to the previous minimum value, the next-to-minimum value may be replaced with the magnitude of the incoming message, and the location of the minimum value may be set to the previous location of the minimum value. When the magnitude of an incoming message is greater than the previous minimum value and the previous next-to-minimum value, the minimum value may be set to the previous minimum value, the next-to-minimum value may be set to the previous next-to-minimum value, and the location of the minimum value may be set to the previous location of the minimum value.

In addition, for a respective edge of the check node which is the edge location of the previous minimum value, the minimum value and the next-to-minimum value may be set based on the magnitude of an incoming message as follows. When the magnitude of an incoming message is at most equal to the previous next-to-minimum value, the minimum value may be replaced with the magnitude of the incoming message, and the next-to-minimum value may be set to a maximum value. When the magnitude of an incoming message is greater than the previous next-to-minimum value, the minimum value may be set to the previous next-to-minimum value, and the next-to-minimum value may be replaced with the magnitude of the incoming message.

In a variant of that implementation, setting the next-to-minimum value to the maximum value may include setting the next-to-minimum value to infinity. In another variant of that implementation, setting the next-to-minimum value to the maximum value may include setting the next-to-minimum value to a highest value supported by the decoder.

In such an implementation, approximating the location of the minimum value may include setting the location of the minimum value to a position displaced one position anticyclically from the previous location of the minimum value.

In such an implementation, storing information regarding the signs of incoming messages may include storing a result of an exclusive-OR operation on all incoming signs up to a present time, and storing all current incoming signs.

In such an implementation, the return message may have a sign determined from the result of the exclusive-OR operation on all incoming signs up to the present time and from the incoming sign on the respective edge, and when the respective edge is the previous location of the minimum value, the returned message may have a magnitude equal to the stored next-to-minimum value, and when the respective edge is other than the previous location of the minimum value, the returned message may have a magnitude equal to the stored minimum value.

According to implementations of the subject matter of this disclosure, a message-passing decoder in a communication channel includes a plurality of variable nodes, a plurality of check nodes, memory at each check node for storing a minimum value among magnitudes of incoming messages on all edges, a next-to-minimum value among magnitudes of incoming messages on all edges, an edge location of the minimum value, and information regarding signs of incoming messages.

The message-passing decoder also includes decoder circuitry, where the decoder circuitry receives, at respective edges of the check node, incoming messages from respective variable nodes, for a respective edge of the check node which is other than the edge location of the previous minimum value, the decoder circuitry sets the minimum value and the next-to-minimum value, and sets the location of the minimum value, based on the magnitude of an incoming message, for a respective edge of the check node which is the edge location of the previous minimum value, the decoder circuitry sets the minimum value and the next-to-minimum value based on the magnitude of the incoming message, and when the magnitude of the incoming message is at most equal to the previous next-to-minimum value, the decoder circuitry sets the location of the minimum value to the respective edge, and when the magnitude of the incoming message is greater than the previous next-to-minimum value, the decoder circuitry approximates the location of the minimum value.

For a respective edge, the decoding circuitry sends a return message on that respective edge based on the stored minimum value up to the present time, the stored next-to-minimum value up to the present time, the stored location of the minimum value, the stored result of the exclusive-OR operation on all incoming signs up to the present time, and the stored incoming sign on the respective edge.

In such an implementation, for a respective edge of the check node which is other than the edge location of the previous minimum value, when the magnitude of an incoming message is at most equal to the previous minimum value, the decoder circuitry may replace the minimum value with the magnitude of the incoming message, sets the next-to-minimum value to a maximum value, and may set the location of the minimum value to the respective edge. When the magnitude of the incoming message is greater than the previous minimum value and at most equal to the previous next-to-minimum value, the decoder circuitry sets the minimum value to the previous minimum value, replaces the next-to-minimum value with the magnitude of the incoming message, and sets the location of the minimum value to the previous location of the minimum value.

When the magnitude of the incoming message is greater than the previous minimum value and the previous next-to-minimum value, the decoder circuitry sets the minimum value to the previous minimum value, sets the next-to-minimum value to the previous next-to-minimum value, and sets the location of the minimum value to the previous location of the minimum value. For a respective edge of the check node which is the edge location of the minimum value, when the magnitude of the incoming message is at most equal to the previous next-to-minimum value, the decoder circuitry replaces the minimum value with the magnitude of the incoming message, and sets the next-to-minimum value to the maximum value, and when the magnitude of the incoming message is greater than the previous minimum value, the decoder circuitry sets the minimum value to the previous next-to-minimum value, and replaces the next-to-minimum value with the magnitude of the incoming message.

In a first variant of that implementation, the maximum value is infinity. In a second variant of that implementation, the maximum value is a highest value supported by the decoder.

In such an implementation, the decoding circuitry approximates the location of the minimum value by setting the location of the minimum value to a position displaced one position anticyclically from the previous location of the minimum value.

In such an implementation, the information regarding the signs of incoming messages may include a result of a first exclusive-OR operation on all incoming signs up to a present time, and all current incoming signs. The message-passing decoder may further comprise first exclusive-OR circuitry for performing the first exclusive-OR operation on all incoming signs up to a present time.

In that implementation, the decoding circuitry further comprises second exclusive-OR circuitry, the return message has a sign determined by a second exclusive-OR operation performed by the second exclusive-OR circuitry on the result of the first exclusive-OR operation and the incoming sign on the respective edge, and when the respective edge is the previous location of the minimum value, the returned message has a magnitude equal to the stored next-to-minimum value, and when the respective edge is other than the previous location of the minimum value, the returned message has a magnitude equal to the stored minimum value.

In such an implementation, the decoder circuitry may operate on messages comprising log-likelihood ratios.

A communication channel according to implementations of this disclosure includes a demodulator that receives digital data and outputs signals indicating whether each particular bit of the digital data is a '0' or a '1', and a message-passing decoder that operates on the signals to decode the digital data. The message-passing decoder includes a plurality of variable nodes, a plurality of check nodes, memory at each check node for storing a minimum value among magnitudes of incoming messages on all edges, a next-to-minimum value among magnitudes of incoming messages on all edges, an edge location of the minimum value, and information regarding signs of incoming messages.

Decoder circuitry receives, at respective edges of the check node, incoming messages from respective variable nodes. For a respective edge of the check node which is other than the edge location of the previous minimum value, the decoder circuitry sets the minimum value and the next-to-minimum value, and sets the location of the minimum value, based on the magnitude of an incoming message. For a respective edge of the check node which is the edge location of the previous minimum value, the decoder circuitry sets the minimum value and the next-to-minimum value based on the magnitude of an incoming message, and, when the magnitude of the incoming message is at most equal to the previous next-to-minimum value, the decoder circuitry sets the location of the minimum value to the respective edge, and when the magnitude of the incoming message is greater than the previous next-to-minimum value, the decoder circuitry approximates the location of the minimum value.

For a respective edge, the decoding circuitry sends a return message on that respective edge based on the stored minimum value up to the present time, the stored next-to-minimum value up to the present time, the stored location of the minimum value, the stored result of the exclusive-OR operation on all incoming signs up to the present time, and the stored incoming sign on the respective edge.

In such an implementation, for a respective edge of the check node which is other than the edge location of the previous minimum value, when the magnitude of an incoming message is at most equal to the previous minimum value, the decoder circuitry replaces the minimum value with the magnitude of the incoming message, sets the next-to-minimum value to a maximum value, and sets the location of the minimum value to the respective edge, when the magnitude of an incoming message is greater than the previous minimum value and at most equal to the next-to-minimum value, the decoder circuitry sets the minimum value to the previous minimum value, replaces the next-to-minimum value with the magnitude of the incoming message, and sets the location of the minimum value to the previous location of the minimum value, and when the magnitude of an incoming message is greater than the previous minimum value and the previous next-to-minimum value, the decoder circuitry sets the minimum value to the previous minimum value, sets the next-to-minimum value to the previous next-to-minimum value, and sets the location of the minimum value to the previous location of the minimum value.

For a respective edge of the check node which is the edge location of the minimum value, when the magnitude of the incoming message is at most equal to the previous next-to-minimum value, the decoder circuitry replaces the minimum value with the magnitude of the incoming message, and sets the next-to-minimum value to the maximum value, and when the magnitude of the incoming message is greater than the previous minimum value, the decoder circuitry sets the minimum value to the previous next-to-minimum value, and replaces the next-to-minimum value with the magnitude of the incoming message.

In such an implementation, the maximum value may be infinity. Alternatively, in such an implementation, the maximum value may be a highest value supported by the decoder.

In such an implementation, the decoding circuitry may approximate the location of the minimum value by setting the location of the minimum value to a position displaced one position anticyclically from the previous location of the minimum value.

In such an implementation, the information regarding the signs of incoming messages includes a result of a first exclusive-OR operation on all incoming signs up to a present time, and all current incoming signs, and the message-passing decoder further includes first exclusive-OR circuitry for performing the first exclusive-OR operation on all incoming signs up to a present time.

In that implementation the decoding circuitry may further include second exclusive-OR circuitry, the return message may have a sign determined by a second exclusive-OR operation performed by the second exclusive-OR circuitry on the result of the first exclusive-OR operation and the incoming sign on the respective edge, and when the respective edge is the previous location of the minimum value, the returned message may have a magnitude equal to the stored next-to-minimum value, and when the respective edge is other than the previous location of the minimum value, the returned message may have a magnitude equal to the stored minimum value.

In such an implementation, the signals may be log-likelihood ratios.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which:

FIG. 9 is a pseudocode representation of a technique according to an implementation of the subject matter of this disclosure for operating a message-passing decoder.

DETAILED DESCRIPTION

A message-passing decoder according to implementations of the subject matter of this disclosure uses less memory than conventional message-passing decoder while converging faster than previously-known reduced storage message-passing decoders.

Figure 1:
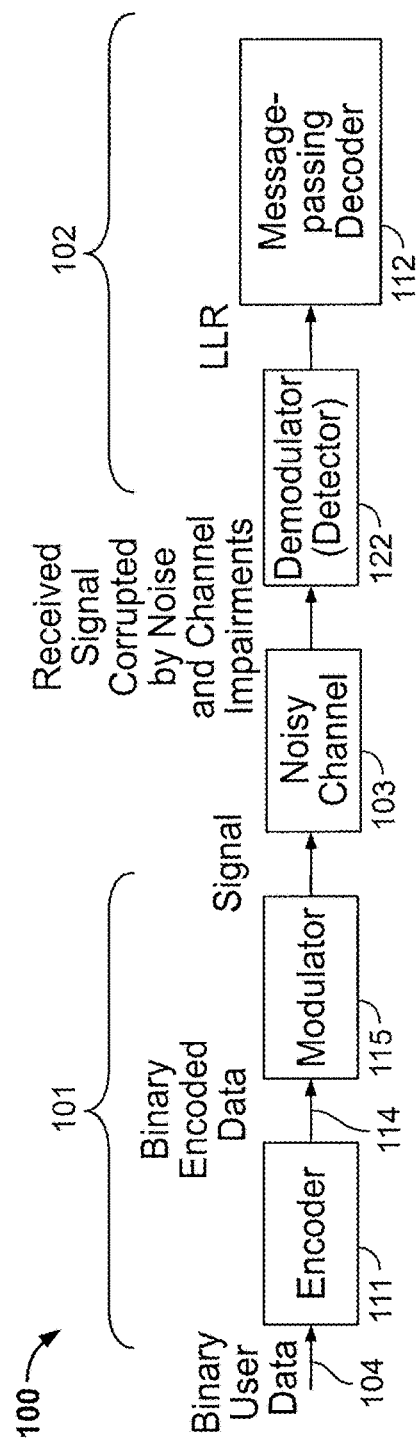
FIG. 1 is a schematic representation of a transceiver channel with which the subject matter of this disclosure can be used.

A message-passing decoder 112 may be used in the receiver portion 102 of a transceiver channel 100 as shown in FIG. 1. Transceiver channel 100 includes transmit portion 101 and receive portion 102, connected by transmission channel 103. Transmit portion 101 includes an encoder 111 which operates on user data 104 which may be created by other circuitry (not shown), or produced by a user using a transducer (e.g., a microphone or keyboard), to create encoded data 114. Encoded data 114 is modulated by modulator 115 and transmitted across channel 103 to receive portion 102, where it is demodulated by demodulator 122 before being decoded by message-passing decoder 112.

Figure 2:
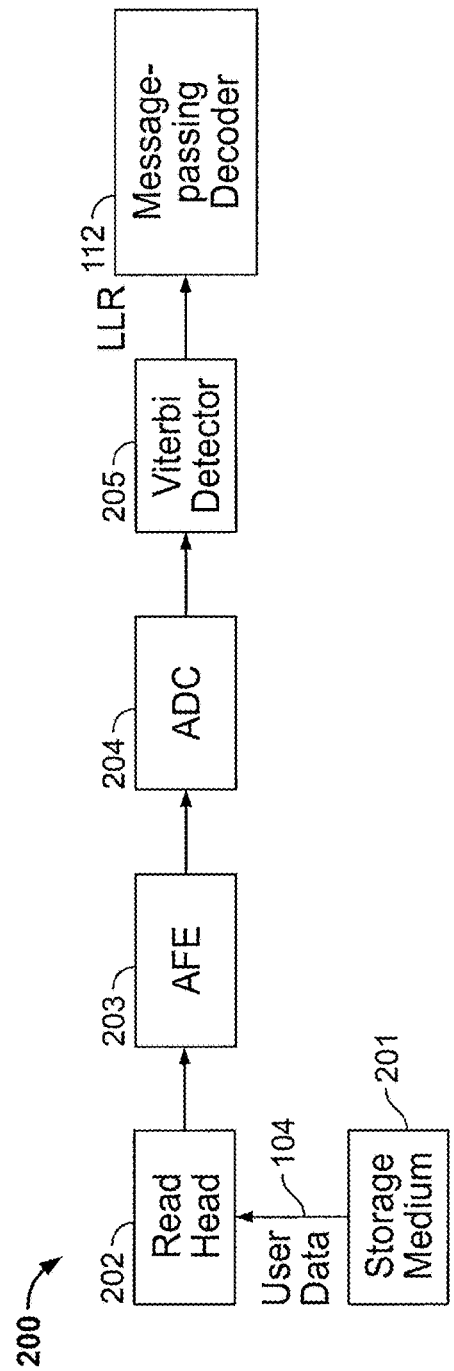
FIG. 2 is a schematic representation of a storage device with which the subject matter of this disclosure can be used.

Similarly, in the case of a storage device 200 as shown in FIG. 2, user data 104 can be read from a storage medium 201 by a read head 202, then passed through an analog front end 203 and an analog-to-digital converter 204 to a detector, such as Viterbi detector 205, before being input to message-passing decoder 112 for decoding.

The output of demodulator 122 or Viterbi detector 205 is in the form of log-likelihood ratios. An LLR $L_k$ is the opinion of demodulator 122 or detector 205, based on the received signal, as to whether the kth bit of encoded data in the received signal is a '0' or a '1'. A positive LLR means that demodulator thinks that the bit is more likely to be a '0', while a negative LLR means that demodulator thinks that the bit is more likely to be a '1'. The magnitude of the LLR is directly proportional to the confidence of the demodulator/detector.

Figure 3:
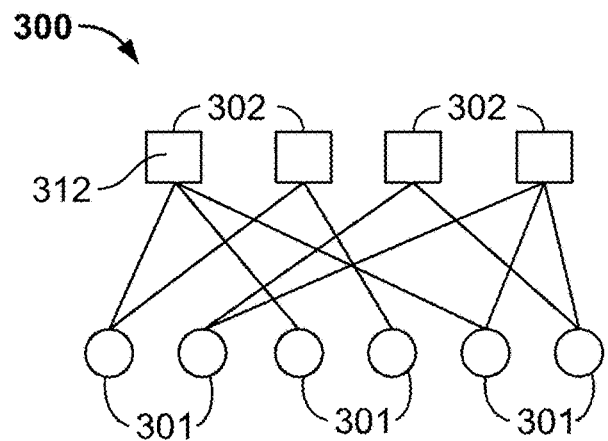
FIG. 3 is a graphic representation of a linear code with which the subject matter of this disclosure can be used.

A linear code, such as an LDPC code, can be represented by a graph such as graph 300 of FIG. 3. In graph 300, circles 301 represent variable nodes, corresponding to encoded data. Squares 302 represent check nodes, which show the check constraints that are imposed on the data by the code. For example, the left-most check node 312 is connected to first, third, and fifth variable nodes 301. This means the code imposes a restriction that the result of an exclusive-OR operation on the first, third, and fifth bits must be '0'.

Figure 4:
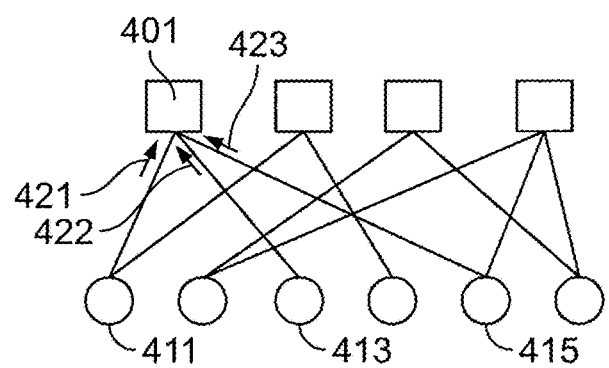
FIGS. 4 and 5 are graphic representations of the operation of a message-passing decoder with which the subject matter of this disclosure can be used.
Figure 5:
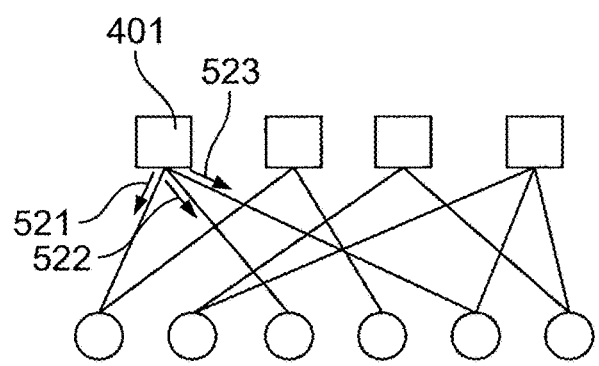

FIG. 4 shows the operation at check nodes of a message-passing decoder that operates in variable node order. For each variable node, all check nodes adjacent that variable node process messages received at adjacent edges. As seen in FIG. 4, check node 401 receives messages 421, 422, 423 from variable nodes 411, 413, 415. At the check node (e.g., check node 401), new messages 521, 522, 523 are computed and returned as shown in FIG. 5. These messages are also in the form of LLRs. Each check node associated with a particular variable node returns messages to that variable node before the decoder moves on to the next variable node.

This process is repeated for all check nodes associated with each variable node, in variable node order, until a stopping criterion is met. The order in which variable nodes are processed is not important, as long as each iteration is in the same order. The stopping criterion may be a set number of iterations. Alternatively, the stopping criterion may be whether the "hard decisions" satisfy all check node conditions. The hard decision of a variable node may be defined as the sign of the sum of all LLRs coming into the variable node. As the decoder progresses, LLRs will change and so will the hard decisions. The decoder may employ logic to monitor whether the hard decisions satisfy all check equations. When the hard decisions satisfy all check equations, the decoder stops, because it can be assumed that the hard decisions form a valid codeword of the code, and that all errors have been corrected. The decoder will output the hard decisions as (presumably) error-free data. As another alternative, the hard decisions can be used in conjunction with a maximum number of iterations. Such a decoder will stop no later than upon reaching the maximum number of iterations, and will stop sooner if the hard decisions satisfy all check equations.

Although a message-passing decoder also may operate in check-node order, implementations of the subject matter of this disclosure relate to computations at the check nodes, when the message-passing decoder operates in variable-node order. A commonly-used computation at a check node involves minimum ("min") and exclusive-OR ("XOR") operations as part of a "min-sum" algorithm (the "sum" operation is used at the variable nodes). According to that computation, the message returned by a check node at a given edge is computed from incoming messages at the other edges (not including that given edge). Specifically, the sign of the returned message is the XOR of the signs of the incoming messages at the other edges, with '0' representing positive sign and '1' representing negative sign. Also according to that computation, the magnitude is the minimum of the magnitudes of incoming messages at the other edges.

As noted above, the computations at each check node are initiated in an order determined by the variable nodes. Specifically, computations may proceed serially starting at a left-most variable node and proceed sequentially to the right-most node, and then resuming again at the left-most node. Other orders are possible, as long as the computations are done at one variable node or group of variable nodes at a time. Each variable node receives incoming messages from check nodes and computes messages to be returned to the check nodes. Therefore, check nodes also generate messages (the "incoming" messages at the variable nodes), and perform computation or recording for messages returned by the variable nodes.

In the examples that follow, for ease of illustration, each check node is shown as trading messages with three variable nodes, which may be referred to as having three "edges." However, in practice, each node may have many more edges—e.g., tens of edges.

Figure 6:
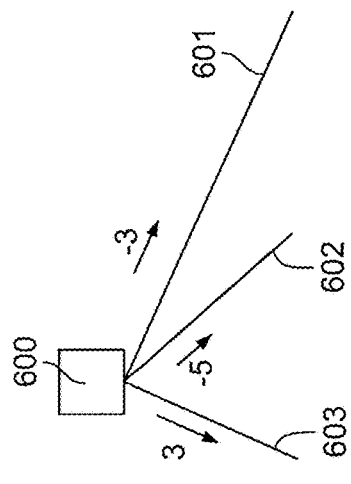
FIGS. 6-8 are graphic representations of the operation of a storage-intensive implementation of a message-passing decoder at a single check node.

Considering the right-most edge 601 at check node 600 in FIG. 6, the incoming messages at the other edges are 5 and −3. The XOR of the sign (i.e., the XOR of '0', representing the positive input, and '1', representing the negative input) is 1 (negative), and the minimum magnitude as between '3' and '5' is '3'. Therefore, the returned message is −3. Similar computations may be carried out for the other edges 602 (yielding a returned message of '−5'), and 603 (yielding a returned message of '3').

Figure 7:
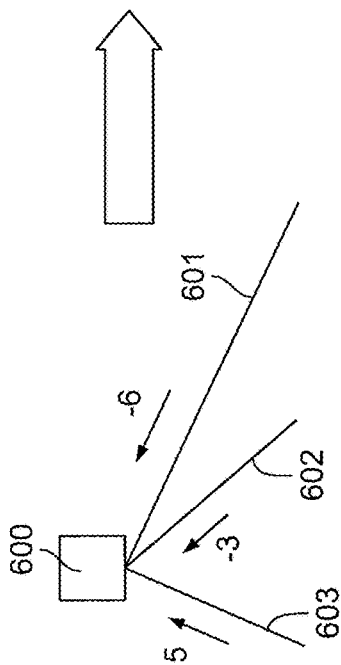

A significant amount of data may be stored at each check node 600 to carry out this procedure. For example, as shown in FIG. 6, check node 600 stores three received messages ('5', '−3' and '−6') from various variable nodes (not shown). If the variable nodes are processed from left to right, then as seen in FIG. 7, the variable node that sent the message ('5') on edge 603 is processed first by check node 600, returning a new message 701 having a magnitude '3' (the minimum as between '3' and '6') and positive sign (the exclusive-OR of two negative signs; the XOR of '1' and '1' is '0' which is positive). On receipt of the new message 701, the variable node may, for example, return a further message ('4') at 702, which is stored by check node 600 in place of the previous incoming message ('5').

Figure 8:
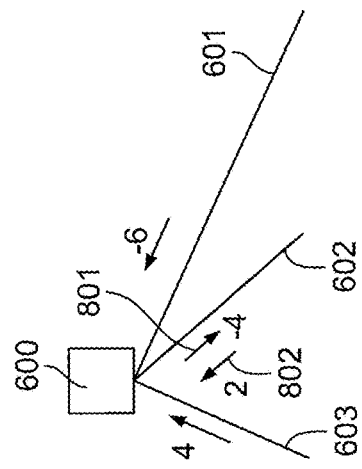

In FIG. 8, moving on to the variable node which sent the message ('−3') on edge 602, check node 600 returns a message 801 ('−4') based on the messages '4' and '−6' on the other two edges 601, 603—the minimum magnitude as between '4' and '6' is '4', and the XOR of positive ('0') and negative ('1') is negative ('1'). On receipt of the new message 801, the variable node may, for example, return a further message ('2') at 802, which is stored by check node 600 in place of the previous incoming message ('−3').

Thus, as shown in FIGS. 7 and 8, a storage-intensive approach stores the sign and magnitude of each message on each edge at each check node to allow computation of return messages.

Alternatively, a reduced-storage approach has been employed. As noted above, the magnitude of returned message at a given edge is the minimum of magnitudes of incoming messages at other edges. Therefore, if the minimum incoming magnitude among all edges is known—call it $min_1$—then it is known that for all edges other than the edge at which $min_1$ is located, the magnitude of the returned message is $min_1$. And for the edge at which $min_1$ is located, the magnitude of the returned message is the next lowest magnitude—call it $min_2$—among the remaining incoming messages. So to determine the magnitude of any returned message, instead of storing all incoming magnitudes, it is necessary to store only $min_1$ and $min_2$ and the location—call it $min_1loc$—of $min_1$.

Similarly, the sign of a returned message at any particular edge is the result of an exclusive-OR of all other incoming signs. However, that is the same as an exclusive-OR of the incoming sign at that particular edge with the result of an exclusive-OR of all incoming signs including that sign. Therefore, one can store the result—call it X—of all incoming signs, along with the individual sign of each incoming edge, and the returned sign for any particular edge will be the result of an exclusive-OR of the incoming sign at that particular edge with X.

As a result, according to the reduced-storage approach, one need store, rather than the magnitude and sign of every incoming message at every edge, only $min_1$, $min_2$, $min_1loc$, X and all of the incoming signs. This reduces the amount of storage significantly, especially when there are many edges (as noted above, there may be tens of edges) connected to the check node. To determine magnitude of a returned message at a particular edge E, if $E=min_1loc$, then the magnitude of the returned message is $min_2$; otherwise, the magnitude of the returned message is $min_1$. And the sign is the exclusive-OR of X and incoming sign at the particular edge E.

As a practical matter, it is necessary to keep two sets of $min_1$, $min_2$, $min_1loc$ and X. A first set is kept constant and used for an entire iteration over all nodes. A second set is updated as new incoming messages arrive. The second set is complete as of the end of an iteration and is used as the new first set for the next iteration. The signs themselves can be treated differently. Each sign is used only to compute the return message on its own edge. Therefore, each sign can be overwritten when the new sign arrives on that respective edge.

The storage-intensive technique, in which all incoming messages are stored in their original form, uses much more memory than the reduced-storage technique, in which only $min_1$, $min_2$, $min_1loc$, X and the signs are stored, especially when the number of edges is large. However, in the storage-intensive technique, each new incoming message is used immediately to update the relevant values for computation of subsequent return messages, whereas in the reduced-storage technique, returned messages computed in the current iteration are all based on values derived from incoming messages in the previous iteration. The information in any new incoming message in any current iteration will not affect returned messages until the next iteration. Therefore, a decoder using the storage-intensive technique will converge faster than a decoder using the reduced-storage technique.

In accordance with implementations of the subject matter of this disclosure, a message-passing decoder converges faster than a decoder using the reduced-storage technique, while providing the advantage of reduced storage. Indeed, the storage requirements for implementations of the subject matter of this disclosure are smaller than the storage requirements of the reduced-storage technique described above.

Specifically, in techniques according to implementations of the subject matter of this disclosure, only one set of the values $min_1$, $min_2$, $min_1loc$ and X are stored. Each of the values $min_1$, $min_2$, $min_1loc$ and X for a particular edge is updated when a new incoming message arrives at that particular edge, and the updated values are used, beginning immediately, to compute return messages based on further incoming messages.

A pseudocode representation 900 of a technique according to an implementation of the subject matter of this disclosure is shown in FIG. 9, in which M is the magnitude of a new incoming message, S is the sign of a new incoming message, and E is the edge location of the new incoming message. At 901, if the edge location $E=min_1loc$, then we know from above that the magnitude of the return message is $min_2$, and $min_1$, which was at that edge location, is going to be replaced by $min_2$. Therefore, $min_2$ is moved into a temporary variable $tmp\_min_1$, and a temporary variable $tmp\_min_2$ is set to infinity (or the largest available value in the system). Because the edge location of $min_2$ has not been stored, the new value for $min_1loc$ is approximated by setting a temporary variable $tmp\_min_1loc$ to $(E-1+N) \bmod N$, where N is the number of edges at the current check node. The effect of this approximation, which moves the value of $min_1loc$ one position anticyclically through all edges, will be addressed below.

Otherwise, at 902, if the edge location $E \neq min_1loc$, then $tmp\_min_1$ is set to $min_1$, $tmp\_min_2$ is set to $min_2$, and $tmp\_min_1loc$ is set to $min_1loc$.

Having thus accounted for the edge location, the incoming magnitude M is processed beginning at 903, where, if $M<=tmp\_min_1$, meaning M is smaller than the smallest previous magnitude, then the value of $min_1$ is set to M, the value of $min_2$ is set to infinity (or the largest available value in the system), and $min_1loc$ is set to E.

At 904, if M was not, at 903, less than or equal to $tmp\_min_1$, meaning M is not smaller than the smallest previous magnitude, then if $M<=tmp\_min_2$, meaning M, while not smaller than the smallest previous magnitude, is smaller than or equal to the next smallest previous magnitude, then the value of $min_1$ is set to $tmp\_min_1$, the value of $min_2$ is set to M, and $min_1loc$ is set to $tmp\_min_1loc$.

At 905, if M was not, at 903, less than or equal to $tmp\_min_1$, and was not, at 904, less than or equal to $tmp\_min_2$, then the value of $min_1$ is set to $tmp\_min_1$, the value of $min_2$ is set to $tmp\_min_2$, and $min_1loc$ is set to $tmp\_min_1loc$. This alternative will never be reached when the new incoming message arrives on the edge on which the previous minimum was located, because in that situation, $tmp\_min_2$ will have been set to infinity at 901.

Having thus accounted for the edge location and the magnitudes, the sign is handled beginning at 906, where X, the exclusive-OR of the signs of all edges, is updated by performing an exclusive-OR operation on X, the current sign of the edge under consideration, and the incoming sign S. That operation results in a new value of X that excludes the current sign of the edge under consideration and adds in the incoming sign S. Then, at 907, the stored sign of the edge under consideration is set to S.

Once the values have been updated as described in FIG. 9, computing a returned message for a given edge E is exactly the same as in the reduced-storage technique described above. That is, for the magnitude, if $E=min_1loc$, then the magnitude is $min_2$ and otherwise the magnitude is $min_1$, and the sign is the result of an exclusive-OR of X and the new stored incoming sign at E.

In some cases, the coding system may include multiple levels or combination of codes or so-called product codes. Decoders for those codes may use different decoding techniques. For example, at one level, a decoder may operate sequentially on check nodes, so that a technique according to an implementation of the subject matter of this disclosure would not apply, but at another level the decoder may operate sequentially on variable nodes and thus a technique according to an implementation of the subject matter of this disclosure can be used at that level.

Where a technique according to an implementation of the subject matter of this disclosure can be used, each new incoming message is reflected immediately in the values of $min_1/min_2/min_1loc/X$, so it takes effect immediately in computing future returned messages, as in the previously-known storage-intensive technique. At the same time, techniques according to implementations of the subject matter of this disclosure use even less memory than the previously-known reduced-storage algorithm, because no memory is need for an extra set of signs or an extra value of X. On the other hand, in implementations of the subject matter of this disclosure, $min_1loc$ is determined by approximation, possibly increasing the number of iterations required for convergence. However, empirical results show that any such effect is acceptably small.

Figure 10:
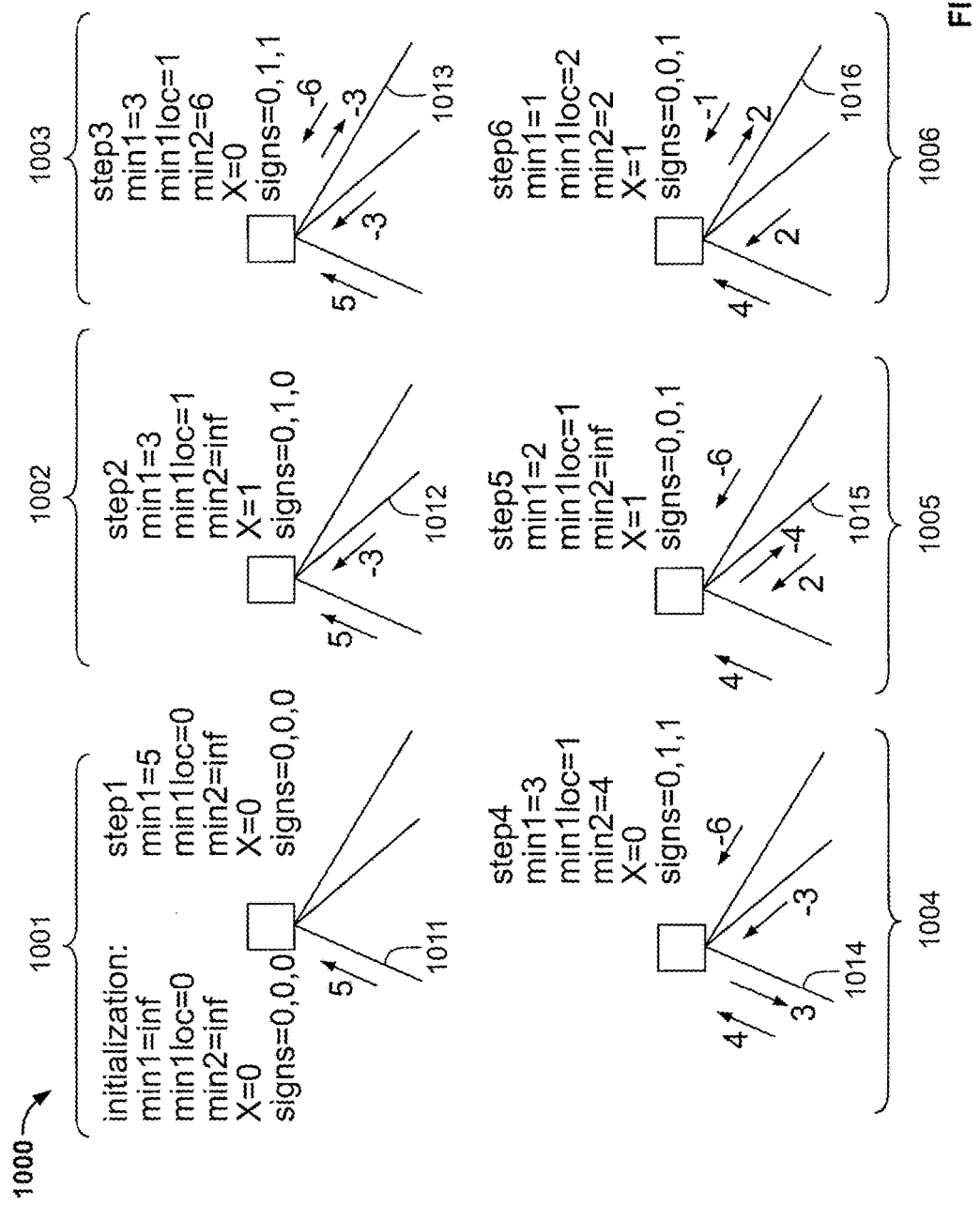
FIGS. 10-12 are graphic representations of examples of the operation of implementations of a message-passing decoder according to an implementation of the subject matter of this disclosure for operating a message-passing decoder.
Figure 11:
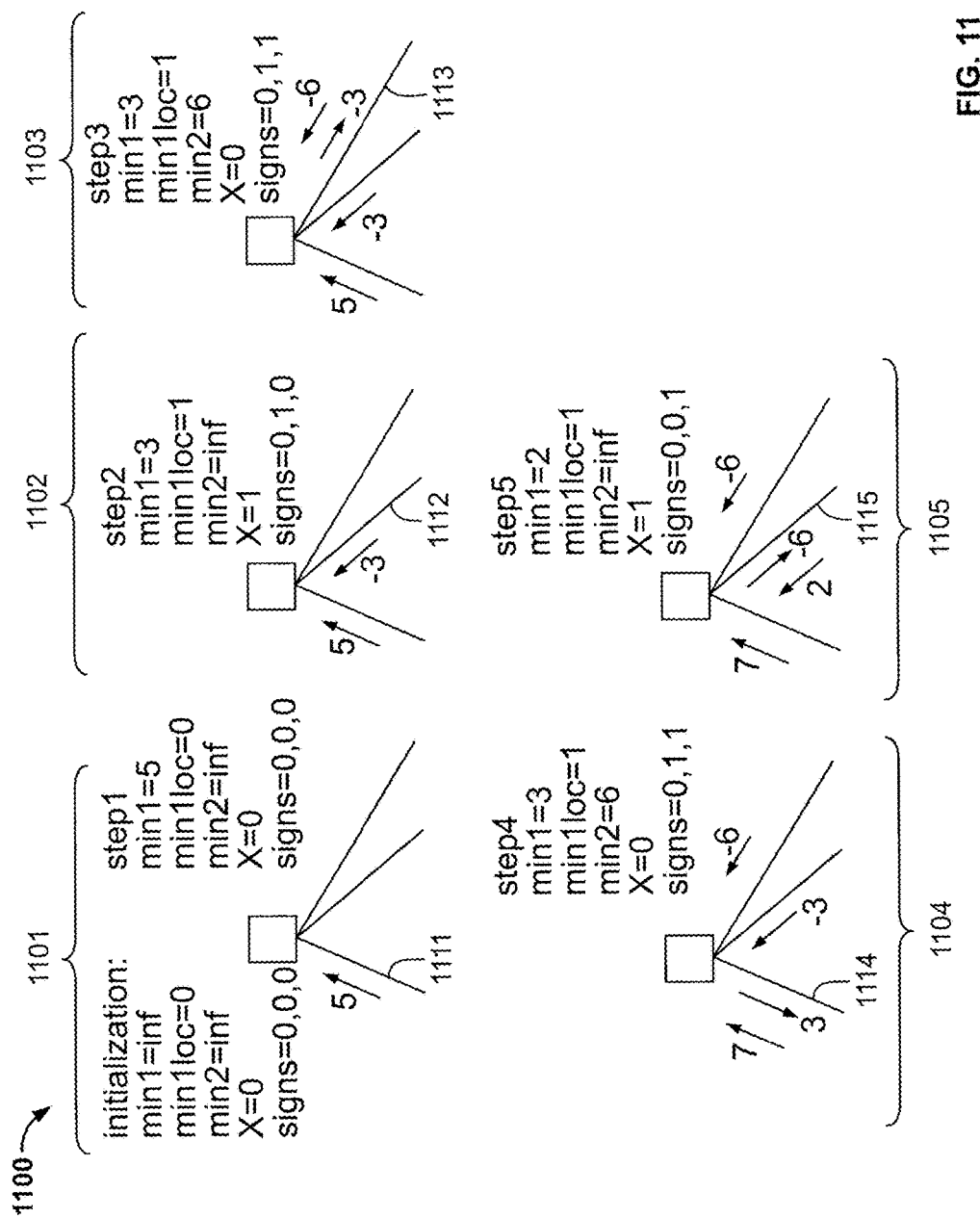
Figure 12:
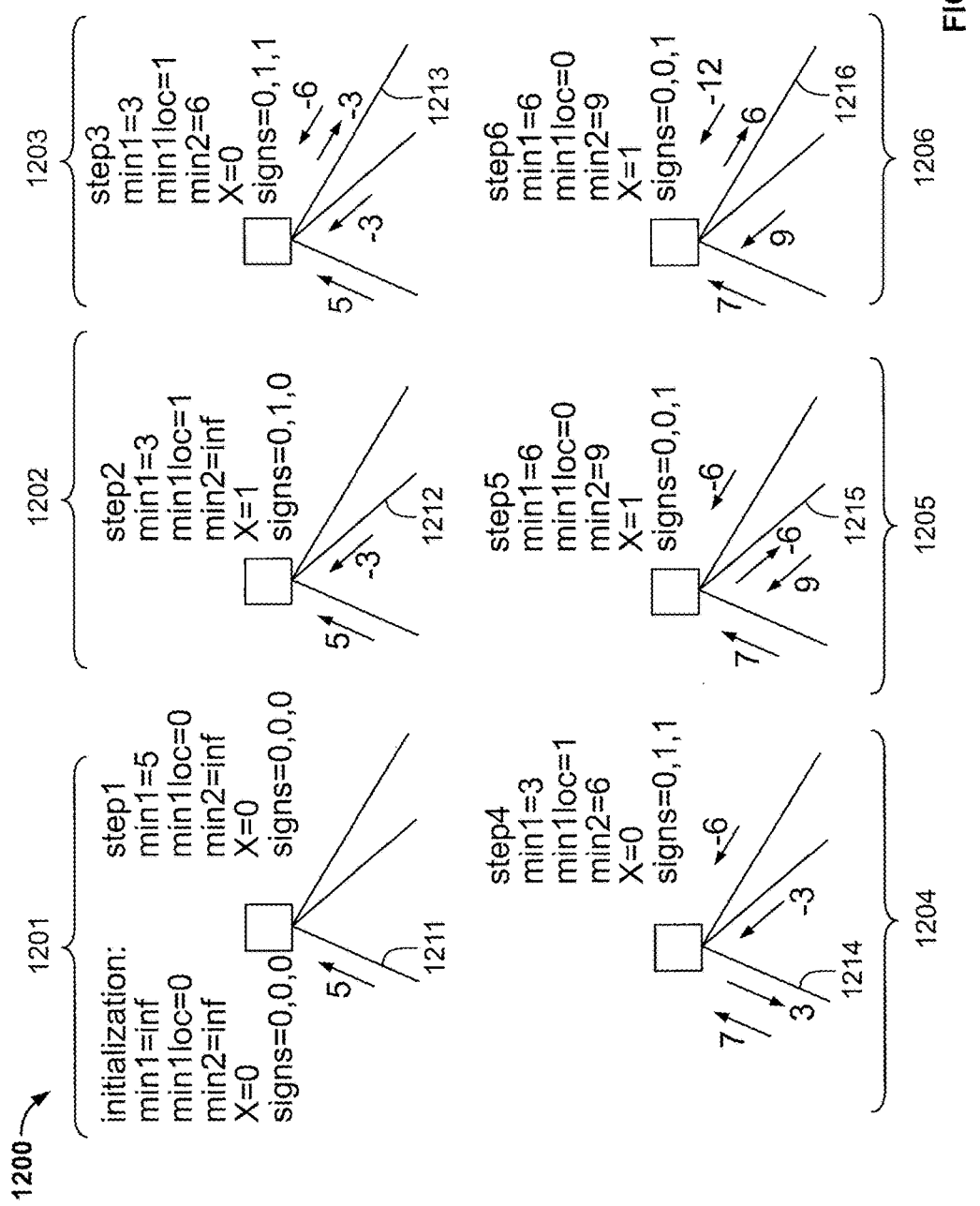

Some examples of the operation of this technique are shown in FIGS. 10-12. In these examples, each step focuses on one edge corresponding to an incoming LLR. A returned LLR can be computed only after processing at least N−1 LLRs, where N is the number of edges. So there are no returned LLRs in the first N−1 steps. As previously noted, only three edges are shown at each node for ease of illustration, but the actual number of edges may be substantially larger.

In a first example 1000, at 1001 in FIG. 10, the various variables ($min_1/min_2/min_1loc/X$ and the signs) are initialized to the values shown. Because there is no data yet, both $min_1$ and $min_2$ are initialized to the highest possible value supported by the hardware system in which the decoder is implemented; those values are identified as "infinity" in the drawings, but may actually be large, but finite, values. The edges are numbered 0, 1, 2, . . . from left to right. The first LLR message arrives on edge '0' (the first edge 1011) with value '5', and the variables are updated as shown. In particular, $min_1$ becomes '5' as the only value available. No return message can yet be computed as noted above.

At 1002, a second LLR message arrives on edge '1' (the second edge 1012) with value '−3'. Again the variables are updated as shown. Here, the magnitude '3' is less than '5', so $min_1$ is set to '3' and $min_2$ is kept at infinity. Because $min_1$ is on the second edge, $min_1loc$ is set to '1'. It still is not possible to compute a return message as noted above.

At 1003, a third LLR message arrives on edge '2' (the third edge 1013) with value '−6'. Again the variables are updated as shown. Here, the magnitude '6' is more than '3' but less than infinity, so $min_1$ is remains '3' and $min_1loc$ is unchanged, while $min_2$ is set to '6'. It is now possible to begin computing return messages. E≠$min_1loc$, so the magnitude is $min_1$=3, and the sign is the XOR of the incoming sign (negative=1) and X=0, which is '1' (negative), so the returned message is '−3'.

At 1004, a fourth LLR message arrives on edge '0' (the first edge 1014) with value '4'. For the returned message, E≠$min_1loc$, so the magnitude is $min_1$=3, and the sign is the XOR of the incoming sign (positive=0) and X=0, which is '0' (positive), so the returned message is '3'. Again the variables are updated as shown. Here, the magnitude '4' is more than '3' but less than '6', so $min_1$ is remains '3' and $min_1loc$ is unchanged, while $min_2$ is set to '4'.

At 1005, a fifth LLR message arrives on edge '1' (the second edge 1015) with value '2'. In this case, E=$min_1loc$. For the returned message, E=$min_1loc$, so the magnitude is $min_2$=4, and the sign is the XOR of the incoming sign (positive=0) and X=1, which is '1' (negative), so the returned message is '−4'. Again the variables are updated as shown. Here, the magnitude '2' is less than '4' (the previous $min_2$, now in tmp_min), so $min_1$ is set to '2'. $min_1loc$ is set to the incoming edge, which happens to leave $min_1loc$ unchanged, while $min_2$ is set to infinity.

At 1006, a sixth LLR message arrives on edge '2' (the third edge 1016) with value '−1'. For the returned message, E=$min_1loc$, so the magnitude is $min_2$=4, and the sign is the XOR of the incoming sign (positive=0) and X=1, which is '1' (negative), so the returned message is '−4'. Again the variables are updated as shown. Here, the magnitude '1' is less than '2', so $min_1$ is set to '1'. $min_1loc$ is set to the incoming edge, so $min_1loc$=2, while $min_2$ is set to infinity.

The returned messages at 1005 and 1006, having values −4 and 2, show how the new stored values are used immediately in accordance with implementations of the subject matter of this disclosure, as in the case of storage-intensive technique described above.

In a second example 1100, at 1101 in FIG. 11, the various variables ($min_1/min_2/min_1loc/X$ and the signs) are initialized to the values shown. Because there is no data yet, both $min_1$ and $min_2$ are initialized to the highest possible value supported by the hardware system in which the decoder is implemented; those values are identified as "infinity" in the drawings, but may actually be large, but finite, values. The edges are numbered 0, 1, 2, . . . from left to right. The first LLR message arrives on edge '0' (the first edge 1111) with value '5', and the variables are updated as shown. In particular, $min_1$ becomes '5' as the only value available. No return message can yet be computed as noted above.

At 1102, a second LLR message arrives on edge '1' (the second edge 1112) with value '−3'. Again the variables are updated as shown. Here, the magnitude '3' is less than '5', so $min_1$ is set to '3' and $min_2$ is kept at infinity. Because $min_1$ is on the second edge, $min_1loc$ is set to '1'. It still is not possible to compute a return message as noted above.

At 1103, a third LLR message arrives on edge '2' (the third edge 1113) with value '−6'. Again the variables are updated as shown. Here, the magnitude '6' is more than '3' but less than infinity, so $min_1$ is remains '3' and $min_1loc$ is unchanged, while $min_2$ is set to '6'. It is now possible to begin computing return messages. E≠$min_1loc$, so the magnitude is $min_1$=3, and the sign is the XOR of the incoming sign (negative=1) and X=0, which is '1' (negative), so the returned message is '−3'.

At 1104, a fourth LLR message arrives on edge '0' (the first edge 1114) with value '7'. For the returned message, E≠$min_1loc$, so the magnitude is $min_1$=3, and the sign is the XOR of the incoming sign (positive=0) and X=0, which is '0' (positive), so the returned message is '3'. Again the variables are updated as shown. Here, the magnitude '7' is more than '3' and more than '6', so $min_1$ is remains '3', $min_2$ remains '6', and $min_1loc$ is unchanged.

At 1105, a fifth LLR message arrives on edge '1' (the second edge 1115) with value '2'. In this case, E=$min_1loc$. For the returned message, E=$min_1loc$, so the magnitude is $min_2$=6, and the sign is the XOR of the incoming sign (positive=0) and X=1, which is '1' (negative), so the returned message is '−6'. Again the variables are updated as shown. Here, the magnitude '2' is less than '6' (the previous $min_2$, now in tmp_$min_1$), so $min_1$ is set to '2'. $min_1loc$ is set to the incoming edge, which happens to leave $min_1loc$ unchanged, while $min_2$ is set to infinity.

If min2 were kept as 5 at 1102, it would return wrong LLR=−5. This example illustrates why $min_2$ is reset to infinity when $min_1$ is updated with a new lower value, rather than moving the previous $min_1$ into $min_2$. If, at 1102, $min_2$ had been set to '5' (the previous $min_1$), then that value would have propagated through and been returned at 1105 instead of '6'.

In a third example 1200, at 1201 in FIG. 12, the various variables ($min_1$/$min_2$/$min_1loc$/X and the signs) are initialized to the values shown. Because there is no data yet, both $min_1$ and $min_2$ are initialized to the highest possible value supported by the hardware system in which the decoder is implemented; those values are identified as "infinity" in the drawings, but may actually be large, but finite, values. The edges are numbered 0, 1, 2, . . . from left to right. The first LLR message arrives on edge '0' (the first edge 1211) with value '5', and the variables are updated as shown. In particular, $min_1$ becomes '5' as the only value available. No return message can yet be computed as noted above.

At 1202, a second LLR message arrives on edge '1' (the second edge 1212) with value '−3'. Again the variables are updated as shown. Here, the magnitude '3' is less than '5', so $min_1$ is set to '3' and $min_2$ is kept at infinity. Because $min_1$ is on the second edge, $min_1loc$ is set to '1'. It still is not possible to compute a return message as noted above.

At 1203, a third LLR message arrives on edge '2' (the third edge 1213) with value '−6'. Again the variables are updated as shown. Here, the magnitude '6' is more than '3' but less than infinity, so $min_1$ is remains '3' and $min_1loc$ is unchanged, while $min_2$ is set to '6'. It is now possible to begin computing return messages. $E \neq min_1loc$, so the magnitude is $min_1$='3', and the sign is the XOR of the incoming sign (negative=1) and X=0, which is '1' (negative), so the returned message is '−3'.

At 1204, a fourth LLR message arrives on edge '0' (the first edge 1214) with value '7'. Again the variables are updated as shown. For the returned message, $E \neq min_1loc$, so the magnitude is $min_1$='3', and the sign is the XOR of the incoming sign (positive=0) and X=0, which is '0' (positive), so the returned message is '3'. Here, the magnitude '7' is more than '3' and more than '6', so $min_1$ is remains '3', $min_2$ remains '6', and $min_1loc$ is unchanged.

At 1205, a fifth LLR message arrives on edge '1' (the second edge 1215) with value '9'. In this case, $E=min_1loc$. For the returned message, $E=min_1loc$, so the magnitude is $min_2$=6, and the sign is the XOR of the incoming sign (positive=0) and X=1, which is '1' (negative), so the returned message is '−6'. Again the variables are updated as shown. Here, the magnitude '9' is more than '3' (the previous $min_2$, now in $tmp\_min_1$), but less than infinity so $min_1$ is set to '2' and $min_2$ is set to '6'. $min_1loc$ is set to $tmp\_min_1loc$, which is the previous edge or '0'. This illustrates the case where the "guess" for $min_1loc$ is wrong, because $min_1loc$ should be '2' and the effect of the wrong guess will be seen below.

At 1206, a sixth LLR message arrives on edge '2' (the third edge 1216) with value '−12'. Again the variables are updated as shown. For the returned message, $E \neq min_1loc$, so the magnitude is $min_1$='6', and the sign is the XOR of the incoming sign (negative=1) and X=1, which is '0' (positive), so the returned message is '6'. Here, the magnitude '12' is greater than '6' and greater than '9', so $min_1$ is left as '6' and $min_2$ is left as '9'. $min_1loc$ is left as '0'.

As mentioned above, the wrong $min_1loc$ was guessed at 1205. Had the correct $min_1loc$ been selected, the value would have been $min_1loc$='2'. Therefore, at 1206, the situation would have been $E=min_1loc$, resulting in $min_2$ being updated to M='12'. Also, the return message would have been '7' according to the storage-intensive technique, rather than '6'. Thus, as discussed above, because $min_1loc$ is determined by approximation in some instances in the technique according to implementations of the subject matter of this disclosure, the number of iterations required for convergence may be increased. However, empirical results show that any such effect is acceptably small, particularly in view of the memory savings.

As used herein and in the claims which follow, the construction "one of A and B" shall mean "A or B."

It will be understood that the foregoing is only illustrative of the principles of the invention, and that the invention can be practiced by other than the described embodiments, which are presented for purposes of illustration and not of limitation, and the present invention is limited only by the claims which follow.

What is claimed is:

1. A method of operating a message-passing decoder on data received in a storage device communication channel, the method comprising:
   storing, at a check node of the message-passing decoder, a minimum value among magnitudes of incoming messages on all edges, a next-to-minimum value among magnitudes of incoming messages on all edges, an edge location of the minimum value, and information regarding the signs of incoming messages;
   receiving, at respective edges of the check node, incoming messages from respective variable nodes;
   for a respective edge of the check node which is other than the edge location of a previous minimum value, setting the minimum value and the next-to-minimum value, and the location of the minimum value, based on magnitude of an incoming message;
   for a respective edge of the check node which is the edge location of the previous minimum value, setting the minimum value and the next-to-minimum value based on the magnitude of the incoming message, and
   when the magnitude of the incoming message is at most equal to the previous next-to-minimum value, setting the location of the minimum value to the respective edge, and
   when the magnitude of the incoming message is greater than the previous next-to-minimum value, approximating the location of the minimum value; and
   for a respective edge, sending a return message on that respective edge based on the stored minimum value up to the present time, the stored next-to-minimum value up to the present time, the stored location of the minimum value at the present time, the stored result of the exclusive-OR operation on all incoming signs up to the present time, and the stored incoming sign on the respective edge.

2. The method of claim 1 wherein:
   for a respective edge of the check node which is other than the edge location of the previous minimum value, setting the minimum value and the next-to-minimum value, and the location of the minimum value, based on the magnitude of the incoming message, comprises:
   when the magnitude of the incoming message is at most equal to a previous minimum value, replacing the previous minimum value with the magnitude of the incoming message, setting the next-to-minimum value to a maximum value, and setting the location of the minimum value to the respective edge,
   when the magnitude of the incoming message is greater than the previous minimum value and at most equal to the next-to-minimum value, setting the minimum value to the previous minimum value, replacing the next-to-minimum value with the magnitude of the incoming message, and setting the location of the minimum value to the previous location of the minimum value, and when the magnitude of the incoming message is greater than the previous minimum value and the previous next-to-minimum value, setting the minimum value to the previous minimum value, setting the next-to-minimum value to the previous next-to-minimum value, and setting the location of the minimum value to the previous location of the minimum value; and for a respective edge of the check node which is the edge location of the previous minimum value, setting the minimum value and the next-to-minimum value based on the magnitude of the incoming message comprises:

when the magnitude of the incoming message is at most equal to the previous next-to-minimum value, replacing the minimum value with the magnitude of the incoming message, and setting the next-to-minimum value to a maximum value, and when the magnitude of the incoming message is greater than the previous next-to-minimum value, setting the minimum value to the previous next-to-minimum value, and replacing the next-to-minimum value with the magnitude of the incoming message.

3. The method of claim 2 wherein setting the next-to-minimum value to the maximum value comprises setting the next-to-minimum value to infinity.

4. The method of claim 2 wherein setting the next-to-minimum value to the maximum value comprises setting the next-to-minimum value to a highest value supported by the decoder.

5. The method of claim 1 wherein approximating the location of the minimum value comprises setting the location of the minimum value to a position displaced one position anticyclically from the previous location of the minimum value.

6. The method of claim 1 wherein the storing information regarding the signs of incoming messages comprises:

storing a result of an exclusive-OR operation on all incoming signs up to a present time; and storing all current incoming signs.

7. The method of claim 1, wherein:

the return message has a sign determined from the result of the exclusive-OR operation on all incoming signs up to the present time and from the incoming sign on the respective edge; and when the respective edge is the previous location of the minimum value, the returned message has a magnitude equal to the stored next-to-minimum value, and when the respective edge is other than the previous location of the minimum value, the returned message has a magnitude equal to the stored minimum value.

8. A message-passing decoder in a communication channel, the message-passing decoder comprising:

a plurality of variable nodes;

a plurality of check nodes;

memory at each check node for storing a minimum value among magnitudes of incoming messages on all edges, a next-to-minimum value among magnitudes of incoming messages on all edges, an edge location of the minimum value, and information regarding signs of incoming messages; and decoder circuitry; wherein:

the decoder circuitry receives, at respective edges of the check node, incoming messages from respective variable nodes;

for a respective edge of the check node which is other than the edge location of the previous minimum value, the decoder circuitry sets the minimum value and the next-to-minimum value, and sets the location of the minimum value, based on magnitude of an incoming message;

for a respective edge of the check node which is the edge location of the previous minimum value, the decoder circuitry sets the minimum value and the next-to-minimum value based on the magnitude of the incoming message, and when the magnitude of the incoming message is at most equal to the previous next-to-minimum value, the decoder circuitry sets the location of the minimum value to the respective edge, and when the magnitude of the incoming message is greater than the previous next-to-minimum value, the decoder circuitry approximates the location of the minimum value; and for a respective edge, the decoding circuitry sends a return message on that respective edge based on the stored minimum value up to the present time, the stored next-to-minimum value up to the present time, the stored location of the minimum value, the stored result of the exclusive-OR operation on all incoming signs up to the present time, and the stored incoming sign on the respective edge.

9. The message-passing decoder of claim 8 wherein:

for a respective edge of the check node which is other than the edge location of the previous minimum value:

when the magnitude of the incoming message is at most equal to the previous minimum value, the decoder circuitry replaces the minimum value with the magnitude of the incoming message, sets the next-to-minimum value to a maximum value, and sets the location of the minimum value to the respective edge, when the magnitude of the incoming message is greater than the previous minimum value and at most equal to the next-to-minimum value, the decoder circuitry sets the minimum value to the previous minimum value, replaces the next-to-minimum value with the magnitude of the incoming message, and sets the location of the minimum value to the previous location of the minimum value, and when the magnitude of the incoming message is greater than the previous minimum value and the previous next-to-minimum value, the decoder circuitry sets the minimum value to the previous minimum value, sets the next-to-minimum value to the previous next-to-minimum value, and sets the location of the minimum value to the previous location of the minimum value; and for a respective edge of the check node which is the edge location of the minimum value:

when the magnitude of the incoming message is at most equal to the previous next-to-minimum value, the decoder circuitry replaces the minimum value with the magnitude of the incoming message, and sets the next-to-minimum value to the maximum value, and when the magnitude of the incoming message is greater than the previous minimum value, the decoder circuitry sets the minimum value to the previous next-to-minimum value, and replaces the next-to-minimum value with the magnitude of the incoming message.

10. The message-passing decoder of claim 9 wherein the maximum value is infinity.

11. The message-passing decoder of claim 9 wherein the maximum value is a highest value supported by the decoder.

12. The message-passing decoder of claim 8 wherein the decoding circuitry approximates the location of the minimum value by setting the location of the minimum value to a position displaced one position anticyclically from the previous location of the minimum value.

13. The message-passing decoder of claim 8 wherein:
the information regarding the signs of incoming messages comprises:
a result of a first exclusive-OR operation on all incoming signs up to a present time, and
all current incoming signs; and
the message-passing decoder further comprises first exclusive-OR circuitry for performing the first exclusive-OR operation on all incoming signs up to a present time.

14. The message-passing decoder of claim 13, wherein:
the decoding circuitry further comprises second exclusive-OR circuitry;
the return message has a sign determined by a second exclusive-OR operation performed by the second exclusive-OR circuitry on the result of the first exclusive-OR operation and the incoming sign on the respective edge; and
when the respective edge is the previous location of the minimum value, the returned message has a magnitude equal to the stored next-to-minimum value, and
when the respective edge is other than the previous location of the minimum value, the returned message has a magnitude equal to the stored minimum value.

15. The message-passing decoder of claim 8, wherein the decoder circuitry operates on messages comprising log-likelihood ratios.

16. A communication channel comprising:
a demodulator that receives digital data and outputs signals indicating whether each particular bit of the digital data is a '0' or a '1'; and
a message-passing decoder that operates on the signals to decode the digital data, the message-passing decoder comprising:
a plurality of variable nodes,
a plurality of check nodes,
memory at each check node for storing a minimum value among magnitudes of incoming messages on all edges, a next-to-minimum value among magnitudes of incoming messages on all edges, an edge location of the minimum value, and information regarding signs of incoming messages, and
decoder circuitry, wherein:
the decoder circuitry receives, at respective edges of the check node, incoming messages from respective variable nodes;
for a respective edge of the check node which is other than the edge location of the previous minimum value, the decoder circuitry sets the minimum value and the next-to-minimum value, and sets the location of the minimum value, based on magnitude of an incoming message;
for a respective edge of the check node which is the edge location of the previous minimum value, the decoder circuitry sets the minimum value and the next-to-minimum value based on the magnitude of the incoming message, and
when the magnitude of the incoming message is at most equal to the previous next-to-minimum value, the decoder circuitry sets the location of the minimum value to the respective edge, and
when the magnitude of the incoming message is greater than the previous next-to-minimum value, the decoder circuitry approximates the location of the minimum value; and
for a respective edge, the decoding circuitry sends a return message on that respective edge based on the stored minimum value up to the present time, the stored next-to-minimum value up to the present time, the stored location of the minimum value, the stored result of the exclusive-OR operation on all incoming signs up to the present time, and the stored incoming sign on the respective edge.

17. The communication channel of claim 16 wherein:
for a respective edge of the check node which is other than the edge location of the previous minimum value:
when the magnitude of the incoming message is at most equal to the previous minimum value, the decoder circuitry replaces the minimum value with the magnitude of the incoming message, sets the next-to-minimum value to a maximum value, and sets the location of the minimum value to the respective edge,
when the magnitude of the incoming message is greater than the previous minimum value and at most equal to the next-to-minimum value, the decoder circuitry sets the minimum value to the previous minimum value, replaces the next-to-minimum value with the magnitude of the incoming message, and sets the location of the minimum value to the previous location of the minimum value, and
when the magnitude of the incoming message is greater than the previous minimum value and the previous next-to-minimum value, the decoder circuitry sets the minimum value to the previous minimum value, sets the next-to-minimum value to the previous next-to-minimum value, and sets the location of the minimum value to the previous location of the minimum value; and
for a respective edge of the check node which is the edge location of the minimum value:
when the magnitude of the incoming message is at most equal to the previous next-to-minimum value, the decoder circuitry replaces the minimum value with the magnitude of the incoming message, and sets the next-to-minimum value to the maximum value, and
when the magnitude of the incoming message is greater than the previous minimum value, the decoder circuitry sets the minimum value to the previous next-to-minimum value, and replaces the next-to-minimum value with the magnitude of the incoming message.

18. The communication channel of claim 17 wherein the maximum value is infinity.

19. The communication channel of claim 17 wherein the maximum value is a highest value supported by the decoder.

20. The communication channel of claim 16 wherein the decoding circuitry approximates the location of the minimum value by setting the location of the minimum value to a position displaced one position anticyclically from the previous location of the minimum value.

21. The communication channel of claim 16 wherein:
the information regarding the signs of incoming messages comprises:
a result of a first exclusive-OR operation on all incoming signs up to a present time, and
all current incoming signs; and the message-passing decoder further comprises first exclusive-OR circuitry for performing the first exclusive-OR operation on all incoming signs up to a present time.

22. The communication channel of claim 21, wherein:

the decoding circuitry further comprises second exclusive-OR circuitry;

the return message has a sign determined by a second exclusive-OR operation performed by the second exclusive-OR circuitry on the result of the first exclusive-OR operation and the incoming sign on the respective edge; and when the respective edge is the previous location of the minimum value, the returned message has a magnitude equal to the stored next-to-minimum value, and when the respective edge is other than the previous location of the minimum value, the returned message has a magnitude equal to the stored minimum value.

23. The communication channel of claim 16, wherein the signals are log-likelihood ratios.

* * * * *